United States Patent
Park et al.

(10) Patent No.: US 6,775,184 B1
(45) Date of Patent: Aug. 10, 2004

(54) NONVOLATILE MEMORY INTEGRATED CIRCUIT HAVING VOLATILE UTILITY AND BUFFER MEMORIES, AND METHOD OF OPERATION THEREOF

(75) Inventors: Joo Weon Park, Pleasanton, CA (US); Poongyeub Lee, San Jose, CA (US)

(73) Assignee: NexFlash Technologies, Inc., San Jose, CA (US)

( * ) Notice: Subject to any disclaimer, the term of this patent is extended or adjusted under 35 U.S.C. 154(b) by 0 days.

(21) Appl. No.: 10/349,384

(22) Filed: Jan. 21, 2003

(51) Int. Cl.$^7$ .............................................. G11C 14/00

(52) U.S. Cl. .............................. 365/185.08; 365/185.2; 365/185.22; 365/154

(58) Field of Search ...................... 365/185.08, 185.12, 365/185.22, 154

(56) References Cited

U.S. PATENT DOCUMENTS

| | | | |
|---|---|---|---|
| 5,291,584 A | | 3/1994 | Challa et al. |
| 5,724,284 A | * | 3/1998 | Bill et al. ................. 365/185.2 |
| 5,724,303 A | | 3/1998 | Gannage et al. |
| 5,822,245 A | | 10/1998 | Gupta et al. |
| 5,862,099 A | | 1/1999 | Gannage et al. |
| 6,373,746 B1 | * | 4/2002 | Takeuchi et al. ....... 365/185.08 |
| 6,373,748 B2 | * | 4/2002 | Ikehashi et al. ....... 365/185.22 |
| 2001/0050861 A1 | | 12/2001 | Yamauchi et al. |
| 2002/0012280 A1 | | 1/2002 | Yamamoto et al. |
| 2002/0041526 A1 | | 4/2002 | Sugita et al. |

OTHER PUBLICATIONS

Tomoharu Tanaka, et al., "A Quick Intelligent Program Architecture for 3V–only NAND–EEPROMs," 1992 Symposium on VLSI Circuits Digest of Technical Papers.
M. Ohi, et al., "An Asymmetrical Offset Source/Drain Structure for Virtual Ground Array Flash Memory with DINOR Operation," Symposium on VLSI Technology, 1993.

* cited by examiner

*Primary Examiner*—Huan Hoang
(74) *Attorney, Agent, or Firm*—Altera Law Group, LLC

(57) ABSTRACT

A memory integrated circuit includes a nonvolatile memory array that is programmed in page mode. A volatile utility memory is connected to the memory array, and is at least a page in size so that an entire page of data that is either being programmed into or read from the memory array may be stored in the utility memory, thereby providing a single readily accessible and fully functional volatile memory that supports a variety of data operations such as nonvolatile memory programming, program-verify when supplemented with a program verify detector, data compare when supplemented with a comparator, and other operations including, in particular, operations that can benefit from the availability of a fast volatile memory to store an entire page of program data or read data. The outputs of the program verify detector, the comparator, and potentially the other operations circuits are furnished to a memory control circuit for controlling the memory or setting particular register values, or may be furnished as output through an I/O circuit that implements data input/output functions and performs various data routing and buffering functions for the integrated circuit memory.

23 Claims, 5 Drawing Sheets

NONVOLATILE MEMORY INTEGRATED CIRCUIT HAVING VOLATILE UTILITY AND BUFFER MEMORIES, AND METHOD OF OPERATION THEREOF

BACKGROUND OF THE INVENTION

1. Field of the Invention

The present invention relates to nonvolatile semiconductor memory, and more particularly to a novel nonvolatile memory integrated circuit architecture and related method for providing access to program data during programming of a nonvolatile array of the memory.

2. Description of the Related Art

Nonvolatile semiconductor memory arrays retain stored data when power is removed, which is required or at least highly desirable in many different types of computers and other electronic devices. Many different types of nonvolatile semiconductor memory devices are known, including a class of single transistor devices that are based on the storage of charge in discrete trapping centers of a dielectric layer of the structure, and another class of devices that are based on the storage of charge on a conducting or semiconducting layer that is completely surrounded by a dielectric, typically an oxide. Stored charge typically is in the form of electrons, which typically are removed from the charge storage structure using the Fowler-Nordheim mechanism to achieve one state, typically called an erased state, and which typically are injected into the charge storage structure using the Fowler-Nordheim ("FN") mechanism, the channel hot electron ("CHE") mechanism, the channel induced secondary electron injection ("CHISEI") mechanism, or the source side injection ("SSI") mechanism to achieve another state, typically called a "programmed" state. Techniques are also known for achieving multiple bit storage in a single transistor nonvolatile memory cell by programming the multiple bits into a memory cell as different voltage levels.

Nonvolatile memory arrays have been used in a variety of different memory integrated circuit architectures. In one type of common memory architecture, the nonvolatile memory array is of the FN/FN type, and uses the Fowler-Nordheim mechanism for both erase and programming. The nonvolatile memory array is programmed from a page of latches, which are part of the memory array input and are used during page mode programming of the nonvolatile memory array to drive a fill page of program data onto the column lines of the nonvolatile memory array for programming into a selected page of memory cells of the nonvolatile memory array. The nonvolatile memory array is read using sense amplifiers, which are part of the memory array output and are used to read the values stored on selected memory cells of the nonvolatile memory array. The latch typically is bypassed by data that is read out of the nonvolatile memory array.

A different memory architecture known as a program/program verify architecture is disclosed in Tomoharu Tanaka et al., "A Quick Intelligent Program architecture for 3V—only NAND-EEPROMs," Symposiun on VLSI Circuits Digest of Technical Papers, 1992, pp. 20–21. The architecture uses a NAND array as its memory array, but access to the memory array is not through an input/output circuit. Instead, each of the data bit lines (to be distinguished from the dummy bit lines) of the memory array is connected to a respective volatile memory element called a read/write ("R/W") circuit. Each R/W circuit acts like a flip-flop type differential sense amplifier in read operation and as a data latch circuit in program operation, thereby providing a fully functional volatile memory element that eliminates the need for separate and dedicated latches and sense amplifiers. A page of such volatile memory elements is provided, so that external page read and write operations are performed not on the memory array itself, but rather on the page of volatile memory elements. Pages of data are transferred between the nonvolatile memory array and the volatile page memory along the bit lines, as required for programming, for a verify read, and for a regular read.

A further advantage of the Tanaka et al. architecture is that as fully functional volatile memory elements, the R/W circuits are used for automatic program verify to verify that all programmed cells have approximately about the same high threshold voltage $V_{TH}$. The program-verify process begins with a write to the nonvolatile memory. To accomplish this, a page of program data is loaded into the R/W circuits and a page of the nonvolatile NAND memory array is programmed from the R/W circuits. The NAND memory array is erased prior to programming, so that the cells begin in a low threshold voltage state. For purposes of programming, "0" data is represented by 8 volts on the bit line node of the R/W circuit, while "1" data is represented by 0 volts on the bit line node of the R/W circuit. Next, the R/W circuit is coupled to the bit line BLa and the complement (dummy) bit line BLb and 18 volts is applied to the control gate of the selected transistor. For 0 data, the 8 volts on the bit line prevents tunneling in the selected transistor, which remains at low $V_{Th}$. For 1 data, the 0 volts on the bit line allows tunneling to occur in the selected transistor, which raises the $V_{Th}$ thereof. Hence, a low $V_{TH}$ charge state is found in an erased or incompletely programmed cell, and a high $V_{TH}$ charge state is found in a satisfactorily programmed cell.

The program-verify process includes a read-verify operation, which begins with precharging the bit and bit complement lines. If a cell stores completely programmed "1" data, its high $V_{TH}$ does not permit it to pull down the bit line, which remains high. On the other hand, if a cell stores 0 data or incompletely programmed data, its low $V_{TH}$ allows it to pull down the bit line.

Next, the charge state of each bit line is adjusted based on the value stored in the R/W circuit to distinguish between "0" data and incompletely programmed data, and the charge state of the bit line is sensed by the R/W circuit. On the first pass, the value stored in the R/W circuit is program data and during subsequent passes it is verify data. In either case, a high voltage on the bit line node of the R/W circuit indicates "no program" because the cell is either erased or fully programmed. If the cell is erased, the bit line is pulled down at first but is recharged by the verify circuit. If the cell is completely programmed, the bit line remains high and is not affected by the verify circuit. The high voltage on the bit line then is read by the R/W circuit, which stores the "no program" message for the next pass. On the other hand, low voltage on the bit line node of the R/W circuit indicates "program" and defeats the verify circuit, so that the charge on the bit line controls. If the cell is not completely programmed, the bit line is pulled down and the low voltage is read by the R/W circuit, which stores a "program" message for the next pass. If the cell is completely programmed the bit line is high and is read by the R/W circuit, which stores a "no program" message for the next pass.

The values in each of the R/W circuits is monitored and the program-verify stopped when all cells are properly programmed. This happens when the bit line nodes of all of the R/W circuits store a high voltage or a logical "1" value.

Unfortunately, the volatile memory formed by the R/W circuits is not independent of the program operation. Program data placed in the R/W circuits for programming to the nonvolatile memory array is destroyed during the program-verify operation, and is therefore unavailable from the R/W circuits after the first verify-read. While the program data can be recovered from memory simply by reading it into the R/W circuits from the memory array after completion of the program-verify operation, disadvantageously the program data is not available from the R/W circuits during programming of the nonvolatile memory array. This situation is illustrated in FIG. 1, which generally shows the timing of a sequence of paired programming and verify read operations 10, 20, 30, 40, 50 and 60, followed by a standard read operation 70. The number of programming and verify read operations during any given program-verify operation is variable depending on the condition of the memory cells in the nonvolatile memory array. As shown in FIG. 1, the volatile memory formed by the R/W circuits is indicated as being BUSY during the entire program-verify operation, as well as during the standard nonvolatile memory read that follows.

BRIEF SUMMARY OF THE INVENTION

In memory integrated circuits, it would be desirable to have page mode programming with program-verify of the type that uses a verify read to nonvolatile memory, even while maintaining the original program data in nonvolatile memory. It would further be desirable, in some embodiments of such memory, to have the program data fully available externally even during page mode programming.

The disadvantages described above and other disadvantages are overcome individually or collectively in one or more of the various embodiments of the present invention. One embodiment of the present invention is an integrated circuit memory comprising a nonvolatile memory array programmable in a page mode; a first memory connected to the memory array, the first memory being volatile memory and of a size sufficient to hold a page of data, and having a program latch capability, a sense amplifier capability, and a verify read capability; a second memory coupled to the first memory, the second memory being volatile memory and of a size sufficient to hold a page of data, and having a buffer capability; and an input/output circuit coupled to the second memory to provide access to the second memory externally of the integrated circuit memory.

Another embodiment of the present invention is an integrated circuit memory comprising; a nonvolatile flash memory array comprising a plurality of single transistor floating gate memory cells, the memory array being programmable in a page mode; a gate circuit for providing a page of simultaneous connections to the flash memory array-during flash memory array program operations and a plurality of successive simultaneous fractional page connections during flash memory array read operations; a volatile utility memory of a size for holding a page of data, the utility memory being connected to the memory array by the gate circuit; a plurality of volatile SRAM buffers, each being of a size for holding a page of data; an input/output circuit; and a plurality of data cells having respective first byte inputs and first byte outputs respectively coupled to the SRAM buffers. Each of the data cells further comprises a second byte input coupled to the utility memory; a second byte output coupled to the utility memory; a shift register having a bit serial input coupled to the input/output circuit, a bit serial output coupled to the input/output circuit, a byte input, and a byte output; a comparator coupled to the first and second byte inputs and having a byte output for providing comparison bits, the byte input of the shift register being coupled to the byte output of the comparator; and a program verifier coupled to the second byte input and having a byte output for providing program verify bits. The memory farther comprises a zero detector having an input coupled to the byte output of the program verifier and having a flag output coupled to the input/output circuit.

Another embodiment of the present invention is a method of writing a page of write data to an integrated circuit nonvolatile memory comprising writing the write data to a page of buffer memory; writing the write data from the buffer memory to a page of utility memory without disturbing the write data in the buffer memory, the utility memory having a latch capability and a verify read capability; programming the write data from the utility memory into a page of a nonvolatile memory array utilizing the latch capability of the utility memory; reading the page of the nonvolatile memory array utilizing the verify read capability of the utility memory to provide verify data in the utility memory; programming the verify data from the utility memory into the page of the nonvolatile memory array utilizing the latch capability of the utility memory when the verify data in the utility memory indicates that programming is incomplete; rereading the page of the nonvolatile memory array utilizing the verify read capability of the utility memory to refresh the verify data in the utility memory in response to the verify data programming step; and ceasing programming of the nonvolatile memory when the verify data in the utility memory indicates that programming is complete.

Another embodiment of the present invention is a method of writing a page of write data to an integrated circuit nonvolatile memory comprising writing the write data to a page of buffer memory; writing the write data from the buffer memory to a page of utility memory without disturbing the write data in the buffer memory, the utility memory having a latch capability and a verify read capability; programming the write data from the utility memory into a page of a nonvolatile memory array utilizing the latch capability of the utility memory; reading the page of the nonvolatile memory array utilizing the verify read capability of the utility memory to provide verify data in the utility memory; programming the verify data from the utility memory into the page of the nonvolatile memory array utilizing the latch capability of the utility memory when the verify data in the utility memory and the write data in the buffer memory indicate that programming is incomplete; re-reading the page of the nonvolatile memory array utilizing the verify read capability of the utility memory to refresh the verify data in the utility memory in response to the verify data programming step; and ceasing programming of the nonvolatile memory when the verify data in the utility memory and the write data in the buffer memory indicates that programming is complete.

DETAILED DESCRIPTION OF THE INVENTION, INCLUDING THE BEST MODE

Figure 2:
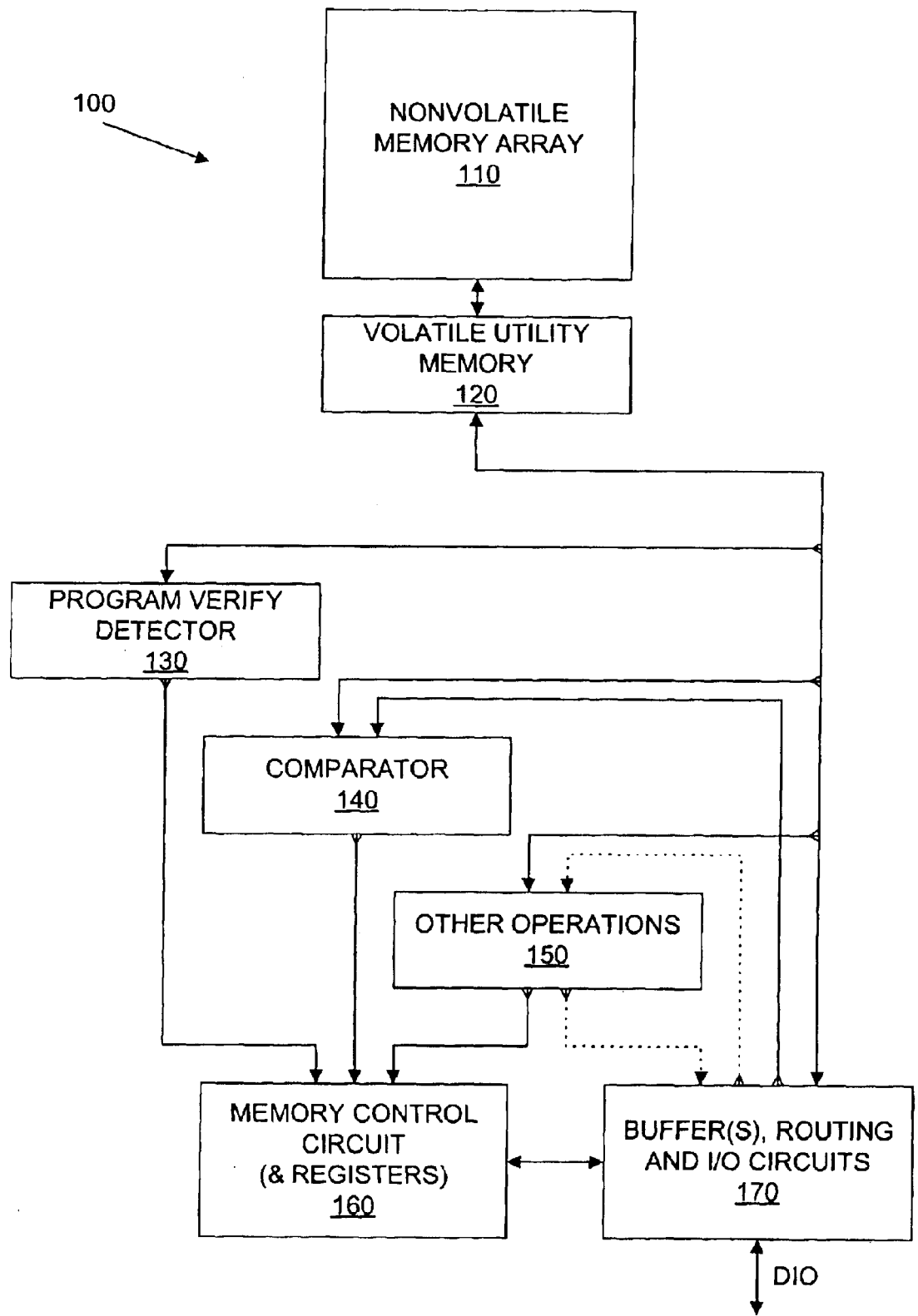
FIG. 2 is a block schematic diagram of a novel memory architecture using a volatile utility memory in combination with one or more buffer memories.

FIG. 2 is a block schematic diagram of a general memory architecture 100 based on a volatile utility memory 120. The memory architecture 100 includes a nonvolatile memory array 110. Preferably, the nonvolatile memory array 110 is an array of single transistor floating gate memory cells which are arranged in a virtual ground configuration and are erased using the Fowler-Nordheim ("FN") mechanism and programmed in page mode using the FN mechanism, although other types of memory cells such as those having split gate transistors, or other types of charge storage structures, or using other types of charge transport mechanisms, may also be used, provided they support page mode programming. A volatile utility memory 120 is connected to the nonvolatile memory array 110. The utility memory 120 is at least a page in size so that an entire page of data that is either being programmed into or read from the nonvolatile memory array 110 may be stored in the volatile utility memory 120, thereby providing a single readily accessible and fully functional volatile memory that supports a variety of data operations such as nonvolatile memory program, program-verify with a program verify detector 130, data compare with the comparator 140, and any other desired operations as represented by block 150, especially operations that can benefit from the availability of a fast volatile memory to store an entire page of program data or read data. The outputs of the program verify detector 130, the comparator 140, and potentially the other operations block 150 are furnished to the memory control circuit 160 for controlling the memory or setting particular register values, as desired, or may be furnished as output through a circuit 170 that implements data input/output ("I/O") functions. Since suitable circuits for controlling memories and setting register values are well known in the art, they are omitted to avoid undue complexity. The circuits 170 also carry out various data routing and buffering functions for the integrated circuit memory 100.

Figure 3:
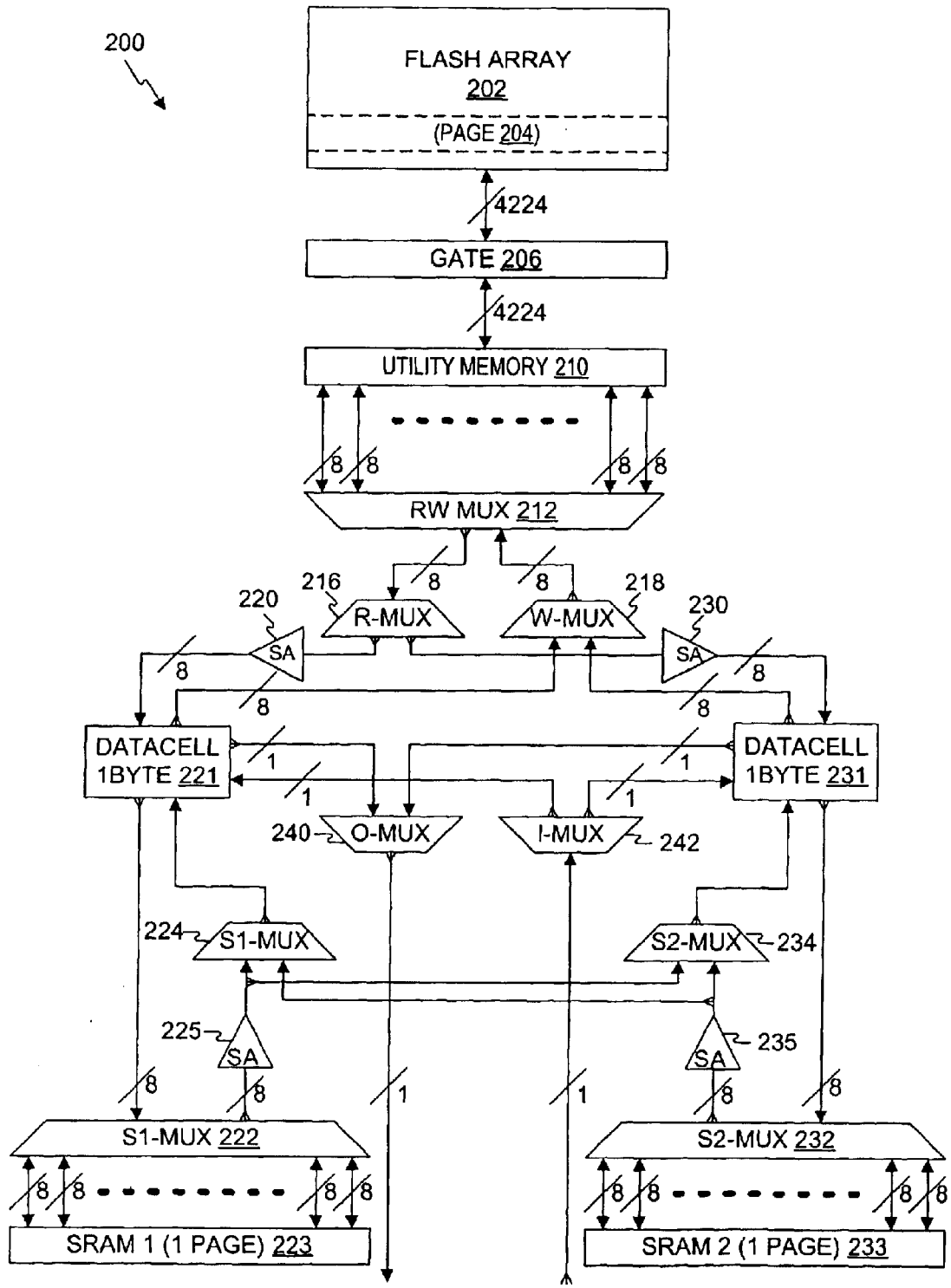
FIG. 3 is a detailed block schematic diagram of an illustrative embodiment of the general memory architecture of FIG. 2.

FIG. 3 is a detailed block schematic diagram of an illustrative embodiment 200 of a part of the general memory architecture of FIG. 2. A nonvolatile array of memory cells such as a flash memory array 202 contains a large number of pages. Generally speaking, a flash memory is any nonvolatile memory in which a large number of memory cells are erased simultaneously, and a page is a group of memory cells that are separately addressable by external commands for such purposes as reading from and writing to the memory. A page may correspond to any suitable physical arrangement of memory, a variety of such arrangements being well know in the art. For purposes of illustration, a page 204 of the flash array 202 is set at 528 bytes or 4224 bits.

A utility memory 210 is connected to the flash array 202 and is at least sufficiently large to store a full page. A variety of different types of volatile memory elements are suitable for use in the volatile utility memory 210. The particular type of connection between the utility memory 210 and the flash array 202 depends on the type of nonvolatile memory used and the number of memory cells that are to be programmed and read at one time. If Fowler-Nordheim programmed cells are used in the flash array 202, a gate 206 may be provided so that all of the 4224 memory elements in the utility memory 210 are simultaneously connected to the flash array 202 and all of the cells of the entire page 204 are programmed together. To read data, the page 204 preferably is read in portions, illustrative of 128 bits each, so that during memory read, the gate 206 simultaneously connects only 128 bits of the page 204 at a time to respective 128 bits of the utility memory 210. Depending on power considerations, more or fewer bits may be read simultaneously.

Figure 4:
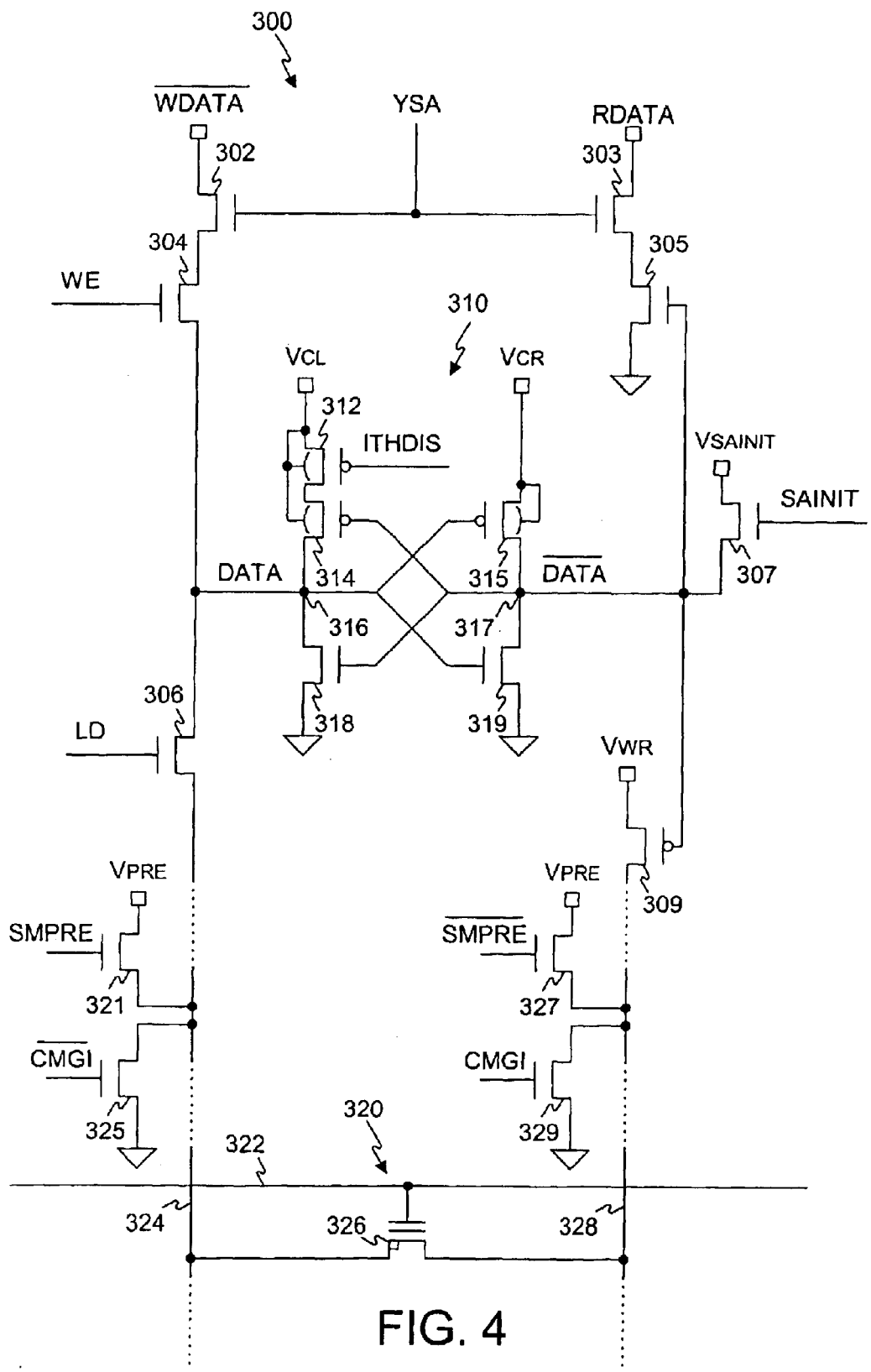
FIG. 4 is a transistor-level schematic diagram of an illustrative embodiment of a memory element suitable for use in the volatile utility memory shown in FIG. 3.

An illustrative volatile memory element 300 suitable for the utility memory 210 is shown in the transistor-level schematic diagram of FIG. 4. The volatile memory element 300 contains a pair 310 of cross-coupled inverters in which a weak inverter is implemented with PMOS transistors 312 and 314 and NMOS transistor 318, and a strong inverter is realized with PMOS transistor 315 and NMOS transistor 319. The PMOS transistor 312 is for power management purposes. In the weak inverter, transistors 312,314 and 318 are connected in series, with the source of transistor 318 being connected to common ground, illustratively 0 volts, and the drain of transistor 312 being connected to $V_{CL}$, illustratively 3.3 volts. In the strong inverter, transistors 315 and 319 are connected in series, with the source of transistor 319 being connected to common ground, illustratively 0 volts, and the drain of transistor 315 being connected to $V_{CR}$, illustratively 3.3 volts. The n-wells of the PMOS transistors 312 and 314 are tied to $V_{CL}$, and the n-well of the PMOS transistor 315 is tied to $V_{CR}$. For convenience, node 316 is referred to as DATA node, and node 317 is referred to as DATA complement, or /DATA node.

As a fully functional volatile memory, the utility memory 210 may be written to or read from over various different data paths as desired, and is capable of being operated in a variety of different modes, including a "Main Memory Sense and Buffer" mode, a "Read from Buffer" mode, a "Program" mode, a "Program-Verify" mode, and a "Write to Buffer" mode. These modes are now described for the memory 200 of FIG. 3 in which each of the memory elements of the utility memory 210 is, for purposes of illustration, the volatile memory element 300 (FIG. 4), and in which the flash array 202 illustratively contains an array of single transistor floating-gate type nonvolatile memory cells such as the transistor 326 in the cell 320 (FIG. 3) that are both erased and programmed using the Fowler-Nordheim mechanism. Illustratively, the memory cells of the flash array 202 have a high threshold voltage $V_{TH}$ to indicate a "1" state, and a low $V_{TH}$ to indicated a "0" state. It will be appreciated that these conventions are illustrative, and that different conventions may be adopted if desired.

The utility memory 210 is used to sense and buffer data in the "Main Memory Sense and Buffer" mode as follows. The cross-coupled inverter pair 310 is initialized by applying a sense amp initialization signal SAINIT to turn on transistor 307, which causes a sense amp initialization voltage $V_{SAINIT}$ of 0 volts to be applied to the /DATA node 317. The /DATA node 317 thereby becomes "0" while DATA node 316 becomes "1." The bit line 324 for the selected transistor 326 is precharged to $V_{PRE}$=1.5 volts through transistor 321 under control of signal SMPRE, and the bit line 328 is brought to ground through transistor 329 under control of signal CMGI. Transistor 306 is turned on by a load control signal LD, and the word line 322 for the selected transistor 326 is raised to 3 volts. If the selected memory transistor 326 stores a "1," i.e. has a high $V_{TH}$, the resulting low current flow, illustratively less than about 5 µA, is not sufficient to pull down the DATA node 316. Accordingly, the DATA node 316 remains high or "1" so that the cross-coupled inverter pair 310 thereby reads the "1" stored in the selected transistor 326. The /DATA node 317 remains low or "0." If the selected memory transistor 326 stores a "0," ie. has a low $V_{TH}$, the resulting high current flow is sufficient to pull down the DATA node 316 of the volatile memory element 310. Accordingly, the DATA node 316 goes low or "0" so that the cross-coupled inverter pair 310 thereby reads the "0" stored in the selected transistor 326. The /DATA node 317 goes high or "1."

The utility memory 210 furnishes buffered data in the "Read from Buffer" mode as follows. The data is stored in the cross-coupled inverter pair 310. The Y-select address signal YSA turns on transistor 303 and the read data RDATA either remains high or is pulled to ground depending on the value stored in the cross-coupled inverter pair 310. If a "1" is stored, the /DATA node 317 is low and the isolation transistor 305 is off, whereby the read data RDATA is not pulled to ground so that a "1" is read. If a "0" is stored, the /DATA node 317 is high and the isolation transistor 305 is on, whereby the read data RDATA is pulled to ground and a "0" is read.

The utility memory 210 is used to latch data for the "Program" mode into the /DATA node 317 as follows. A Y-select address signal YSA turns on transistor 302 and a write-enable signal WE turns on transistor 304, thereby supplying a current to the DATA node 316 that is dependent on the value of the write data complement /WDATA. Control signal LD is low to turn to hold transistor 306 off if the write data is "1" then /WDATA is "0," the DATA node 316 is pulled down, and the /DATA node 317 goes high, thereby latching the "1" write data at the /DATA node 317. On the other hand, if the write data is "0" then /WDATA is "1," the DATA node 316 goes high, and the /DATA node 317 goes low, thereby latching "0" data at the /DATA node 317.

Programming of a page of the flash array 202 is done in the following manner. The page to be programmed is assumed to be erased, which can be accomplished by a bulk erase of multiple pages of the array 202 or of the entire array 202, or which can be accomplished by an erase of only the page to be programmed. An erase of a page may be performed by bringing the appropriate word line and channel regions (and/or sources and/or drains, depending on the memory array design) to suitable respective voltages, illustratively 6 volts and minus 11 volts respectively, so that electrons tunnel to the floating gates. The entire page of single transistor memory cells thereby acquire a high threshold condition, illustratively $V_{TH}$~5 volts. It will be appreciated that multiple pages, individual and multiple sectors (if the memory array has multiple sectors) and even the entire memory may be erased in bulk in essentially the same manner.

Assume that write data having a value of "1" is latched in the cross-coupled inverter pair 310 and is now to be written to the memory cell 320. In this event, /DATA node 317 is high, illustratively 5 volts, and is applied to transistor 309. As a result, transistor 309 is off and the high $V_{TH}$ state of the memory cell 320 indicating a "1" is not changed.

Assume instead that write data having a value of "0" is latched in the cross-coupled inverter pair 310 and is now to be written to the memory cell 320. In this event, the /DATA node 317 is low, illustratively 0 volts, and is applied to transistor 309.

As a result, transistor 309 is on and the write voltage $W_{VR}$ is applied to the drain of the transistor 326 in the memory cell 320 via the bit line 328. Assuming for purposes of illustration that the write voltage $V_{WR}$ is 5 volts, and that an initial program pulse of negative voltage is applied to the control gate of the transistor 326 via the word line 322, the $V_{TH}$ of the transistor 326 is reduced due to electron tunneling from the floating gate.

The utility memory 210 is also designed to sense and buffer program-verify data for the "Program-Verify" mode. Program-verify is performed because some cells may program more slowly than others, due to normal variations between nonvolatile memory cells in a nonvolatile memory array. If all cells are programmed together so that the slow cells are adequately programmed, the fast cells may be programmed into a negative $V_{TH}$ state. Since the single transistor cells of some types of nonvolatile memory do not have select transistors, the negative $V_{TH}$ cells would conduct at inappropriate times.

To avoid over-programming any of the nonvolatile memory cells, the initial program cycle is configured to program only the very fastest memory cells by applying a programming pulse of illustratively –5 volts. When the initial program cycle completes, some of the memory cells in the nonvolatile memory array likely have not achieved a suitably low $V_{TH}$. A verify read is performed to identify these incompletely programmed memory cells. Subsequent program-verify cycles are undertaken to program only the incompletely programmed memory by identifying them and applying progressively more negative programming pulses (say –5.5 volts, –6.0 volts, –6.5 volts and so forth up to a maximum of say –12.0 volts) to program them, until all memory cells to be programmed are programmed, or until all of the program-verify cycles are completed.

The verify read is designed to determine the need for continued programming of a cell, not to read the data in the cell per se. After a verify read, the value "1" stored in /DATA node 317 of the cross-coupled inverter pair 310 represents "do not program" because the memory cell 320 either is to remain erased or has been fully programmed, and prevents programming voltage from being supplied to the bit line 328 for the memory cell 320. Conversely, the value "0" stored in /DATA node 317 of the cross-coupled inverter pair 310 represents "need more programming" because the memory cell 320 has not been sufficiently programmed, and causes a programming voltage $V_{WR}$ to be supplied to the bit line 328 for the memory cell 320.

A verify read is performed by reading the memory cell 320 with the cross-coupled inverter pair 310 as in the "Main Memory Sense and Buffer" mode, but without initializing the cross-coupled inverter pair 310. To prepare for reading the memory cell 320, the bit line 324 is pre-charged through transistor 321 and the bit line 328 is brought to ground through transistor 329. To perform a read of the memory cell 320, transistor 306 is turned on by a load control signal LD and the word line 322 for the selected cell 320 is raised to 3 volts.

Without initialization of the inverter pair 310, the /DATA node 317 could store either a "0" value or a "1" value. If the value "1" indicating "programming done" is stored, this value will not be affected by the state of the transistor 326 for the following reason. If the transistor 326 is erased and in a high $V_T$ state, it does not discharge the bit line 324 so that the precharge voltage on the bit line 324 is applied to the DATA node 316. However, the precharge voltage is not sufficient to change the state of the cross-coupled inverter pair 310, so that the /DATA node 317 remains high. On the other hand, if the transistor 326 is fully programmed and in a low $V_T$ state, a conductive path is established between the DATA node 316 and the bit line 328. Since the bit line 328 is low, it pulls down the pre-charged bit line 324 so that the DATA node 316 remains "0" and the /DATA node 317 remains high.

If the /DATA node 317 is "0" indicating "more programming," then the verify read will be reading transistor 326 when it is either fully programmed as a result of the last programming cycle, or is not yet fully programmed. If the transistor 326 is not yet fully programmed and therefor in a relatively high $V_T$ state, the transistor 326 is unable to pull down the DATA node 316, so that the /DATA node 317 remains "0," indicating that the transistor 326 is to be subject to another programming cycle. However, if the transistor 326 is sufficiently programmed and in a sufficiently low $V_T$ state, a strongly conductive path is established between the DATA node 316 and the grounded bit line 328. The DATA node 316 is pulled to "0" and the /DATA node 317 goes to "1" to prevent programming on the next program cycle, if any.

At the point in the program cycle when all memory cells that are to be programmed have been satisfactorily programmed, all volatile memory elements of the utility memory 120 store a "1" on the /DATA node 317, which is read as a "0" on the RDATA output of the volatile memory element 300.

The progress of the program-verify operation as indicated by the contents of the volatile utility memory 120 is monitored in any desired manner. In one illustrative technique, the verify data in the utility memory 210 is processed after each verify read to detect the presence of all zeros on the RDATA outputs of the utility memory 210. Programming cycles are repeated until all zeros are detected or until the maximum number of programming cycles is executed. In an alternative illustrative technique, both the original write data and the verify data in the utility memory 210 are processed after each verify read to detect ones in the write data (cells that are not to be programmed, i.e. to remain erased) and zeros in the verify data where there are zeros in the write data (cells that are to be programmed and are successfully programmed). The processing may be done in any desired way, as, for example, by using combinatorial logic and one or more status registers.

The utility memory 210 may be used as a register or as a buffer to store data in a "Write to Buffer" mode as follows. A Y-select address signal YSA turns on transistor 302 and a write-enable signal WE turns on transistor 304, thereby supplying a current to the DATA node 316 that is dependent on the value of the data STOREDATA to be stored in the utility memory 210. If STOREDATA is "0," the DATA node 316 is pulled down, thereby latching the "0" data therein. On the other hand, if STOREDATA is "1" the DATA node 316 goes high, thereby latching the "1" data therein.

Figure 5:
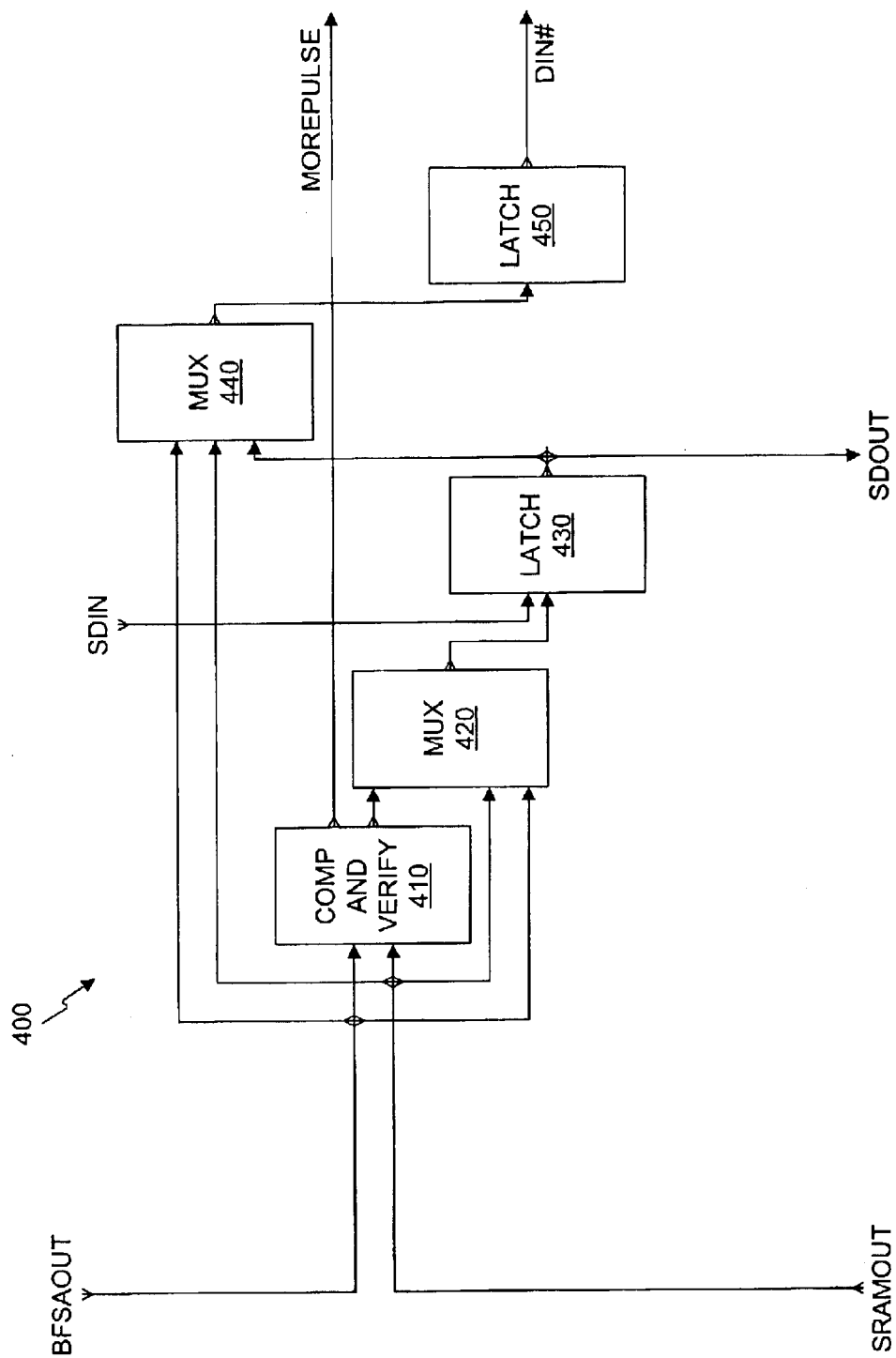
FIG. 5 is a detailed block schematic diagram of an illustrative embodiment of a shift register and latch circuit suitable for use in the memory embodiment of FIG. 3.

FIG. 5 is a detailed block schematic diagram of an illustrative embodiment of one bit of a data cell circuit 400 suitable for use in the data cells 221 and 231 of the illustrative memory architecture embodiment of FIG. 3. The data cell circuit 400 has a number of inputs, including bit BFSAOUT from a sense amplifier for the utility memory 210, illustratively either sense amplifier 220 or 230 (which help improve circuit speed), and a bit SRAMOUT from an SRAM buffer, illustratively either SRAM buffer 223 or 233. The data cell circuit 400 also includes a data output DIN for furnishing a data bit in parallel with other data bits, for example as input data to the utility memory 210 through write multiplexer 218 and read/write multiplexer 212 (FIG. 3). The data cell circuit 400 also includes a serial data input SDIN and a serial data output SDOUT.

The serial data input SDIN is used in the following manner. In an 8 bit data cell, for example, SDIN of the most significant bit data cell carries serial input data, which is latched in the latch 430 and shifted through SDOUT to the SDIN of the next most significant bit data cell. In this manner, eight bits of serial input data is shifted into eight latches 430, the contents of which may be transferred to eight respective latches 450 through eight respective multiplexers 440. The data is then available as parallel data DIN0 through DIN7.

The serial data output SDOUT is used in the following manner. SDOUT of the least significant bit data cell is a serial data output, which provides data from the more significant bit data cells as it is shifted through the respective latches 430.

The data cell circuit 400 implements a data compare of BFSAOUT and SRAMOUT in the following manner. The bits BFSAOUT and SRAMOUT are compared in compare and verification block 410, which illustratively outputs a "0" to the multiplexer 420 if the bits are the same, and outputs a "1" if the bits are different. The compare block 410 may be implement in any suitable manner, illustratively with the use of an exclusive OR logic gate followed by an inverter. The output of the compare block 410 is selected by the multiplexer 420 and transferred to a latch cell 430, from which it may be copied through the multiplexer 440 to the latch 450 and supplied in parallel with other bits as DIN# data, or may be shifted out as serial data through serial data output SDOUT.

The data cell circuit 400 is also able to copy either BFSAOUT or SRAMOUT to the latch 450 via the multiplexer 420, the latch 430, and the multiplexer 440. The copied bit is available as DIN# in parallel with other bits from other data cell circuits 400 in the byte.

The data cell circuit 400 is also able to output either BFSAOUT or SRAMOUT as serial data. Either BFSAOUT or SRAMOUT is selected by the multiplexer 420 and transferred to the latch cell 430, from which it is shifted out as serial data through the serial data output SDOUT.

The data cell circuit 400 also processes verify data from the utility memory 210. In one technique, herein referred to for convenience as the "transfer" technique, the value of BFSAOUT is essentially transferred out of the compare and verification circuit 410 as the signal MOREPULSE, which is then processed in any desired way, such as by the use of a combinatorial circuit and latch, to detect the presence of all zeros. In another technique, the value of BFSAOUT is supplied to an input of a NAND gate and the inverted value of SRAMOUT is supplied to another input of the NAND gate, and the output of the NAND gate is used to generate the signal MOREPULSE. This arrangement detects ones in the write data (cells that are not to be programmed, i.e. to remain erased) and zeros in the verify data where there are zeros in the write data (cells that are to be programmed and are successfully programmed). As in the first mentioned technique, the signal MOREPULSE is then processed in any desired way, such as by the use of a combinatorial circuit and latch, to detect the presence of all zeros.

When the transfer technique is used for program verify and when one or more volatile page buffer memories (in FIG. 2, the circuit 170) are used in conjunction with the volatile utility memory 120, the volatile utility memory can be used to completely isolate the page buffer or buffers from the nonvolatile memory array 110 during the programming process. In this manner, data can be externally read from the page buffer or buffers, and new data can even be written, while the original write data is being programmed into the nonvolatile memory array 120.

Figure 1:
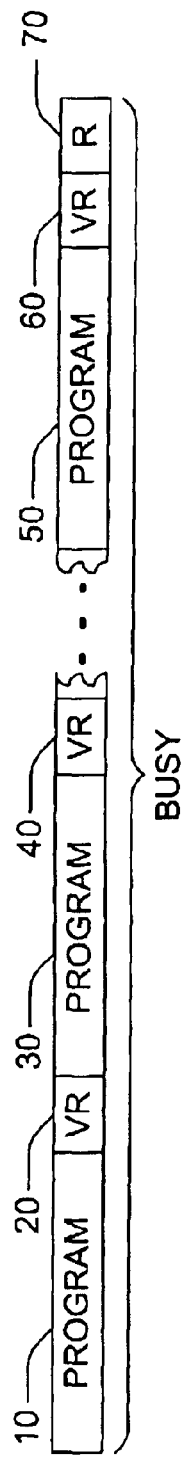
FIG. 1 is a schematic diagram generally showing the relative illustrative timing of a program-verify operation followed by a standard read operation as in the prior art, the program-verify operation having a sequence of paired program and verify-read operations.
Figure 6:
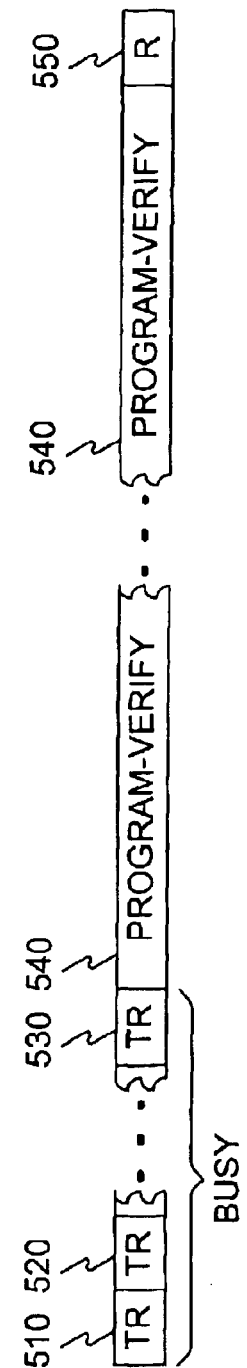
FIG. 6 is a schematic diagram generally showing the relative illustrative timing of a data transfer operation, which is followed by a program-verify operation, which is in turn followed by a standard read operation.

The benefits of having one or more page buffers that are isolated from the programming operation, including program-verify operations, is illustrated in FIG. 6. To program data from a page buffer into the nonvolatile memory array 110, the data is transferred from the nonvolatile page buffer to the nonvolatile memory array 110. Since both memories are nonvolatile, the time required for each bit to transfer is quite short. The total amount of time for the transfer depends on the page size and on how many bits are transferred simultaneously. In the memory embodiment of FIG. 3, for example, the data path of 8 bits permits only eight bits to be transferred simultaneously, although data paths can be designed to carry fewer or more bits simultaneously. FIG. 6 shows a number of transfers represented by 510, 520 and 530 that are required to transfer the page of data from the page buffer to the nonvolatile memory array 110. While the page buffer is unavailable during these transfers because of possible contention issues and is indicated as BUSY, the page buffer becomes available when the last transfer 530 completes. The program-verify operation 540 by which the data in the page buffer is programmed into the nonvolatile memory array 110 actually proceeds from the volatile utility memory 120 to the nonvolatile memory array 110. Because of the speed and reliability of volatile-to-volatile memory transfers, the total time for the volatile-to-volatile memory transfer to complete, as represented by intervals 510, 520 and 530 in FIG. 6, is significantly less than the total time for the illustrative volatile-to-nonvolatile memory transfer of FIG. 1 to complete, as represented by the intervals 10, 20, 30, 40, 50, 60 and 70.

The memory embodiment of FIG. 3 illustratively shows two page buffers, the SRAM buffers 223 and 233. The availability of three page-sized volatile memories, namely the utility memory 210 and the SRAM buffers 223 and 233, creates a great amount of flexibility for the availability of data, and allows the SRAM buffers 223 and 233 to be completely isolated from the flash memory array 202 so that program data can be accessed from the SRAM buffers 223 and 233 even while it is being programmed into the flash memory array 202 from the utility memory 210.

The memory embodiment of FIG. 3 supports a great many different external memory commands, although not all commands need be supported in any particular implementation. Illustrative read memory commands include direct nonvolatile memory page read, nonvolatile memory page read through buffer, nonvolatile memory page to buffer transfer, buffer read, and nonvolatile memory page and buffer compare. Illustrative write memory commands include buffer write, nonvolatile memory page program from buffer with erase, nonvolatile memory page program from buffer without erase, nonvolatile memory page program through buffer, and nonvolatile memory page program without buffer. More complex operations such as read-modify-write are also supported. These are now described with reference to the memory embodiment 200 of FIG. 3.

A direct nonvolatile memory page read involves transferring a page 204 of data from the flash array 202 to the utility memory 210 through the gate 206 in preferably 128 bit segments. The page is then read from the utility memory 210 in eight bit segments over an eight bit data path established by read/write multiplexer 212, read multiplexer 216, sense amplifier 220, and data cell 221, and then is output serially from the data cell 221 through output multiplexer 240. Alternatively, the page may be read from the utility memory 210 in eight bit segments over an eight bit data path established by read/write multiplexer 212, read multiplexer 216, sense amplifier 230, and data cell 231, and then is output serially from the data cell 231 through output multiplexer 240.

In the nonvolatile memory page read through buffer, the command preferably includes an identification of the buffer through which data is to be read, and the data remains in the identified buffer after the read is complete. A page 204 of data is transferred from the flash array 202 to the utility memory 210 through the gate 206 in preferably 128 bit segments. If the first buffer is identified, the page is read from the utility memory 210 in eight bit segments over an eight bit data path established by read/write multiplexer 212, read multiplexer 216, sense amplifier 220, and data cell 221. Next, the data is output serially from the data cell 221 through output multiplexer 240, and also output along an eight bit path through the multiplexer 222 to the SRAM buffer 223. If the second buffer is identified, the page is read from the utility memory 210 in eight bit segments over an eight bit data path established by read/write multiplexer 212, read multiplexer 216, sense amplifier 230, and data cell 231. Next, the data is output serially from the data cell 231 through output multiplexer 240, and also output along an eight bit path through the multiplexer 232 to the SRAM buffer 233.

In the nonvolatile memory page to buffer transfer, the command includes an identification of the buffer to which data is to be transferred, and the data remains in the identified buffer after the read is complete. A page 204 of data is transferred from the flash array 262 to the utility memory 210 through the gate 206 in preferably 128 bit segments. If the first buffer is identified, the page is read from the utility memory 210 in eight bit segments over an eight bit data path established by read/write multiplexer 212, read multiplexer 216, sense amplifier 220, data cell 221, and the multiplexer 222 to the SRAM buffer 223. If the second buffer is identified, the page is read from the utility memory 210 in eight bit segments over an eight bit data path established by read/write multiplexer 212, read multiplexer 216, sense amplifier 230, data cell 231, and the multiplexer 232 to the SRAM buffer 233.

In a buffer read, the command includes an identification of the buffer from which data is to be read, and the data remains in the identified buffer after the read is complete. If the first buffer is identified, the page is read from the SRAM buffer 223 in eight bit segments over an eight bit data path established by multiplexer 222, sense amplifier 225, multiplexer 224, and data cell 221. Next, the data is output serially from the data cell 221 through output multiplexer 240. If the second buffer is identified, the page is read from the SRAM buffer 233 in eight bit segments over an eight bit data path established by multiplexer 232, sense amplifier 235, multiplexer 234, and data cell 231. Next, the data is output serially from the data cell 231 through output multiplexer 240.

It will be appreciated that the functionality of the nonvolatile memory page read through buffer command is achievable by combining the nonvolatile memory page to buffer transfer command with the buffer read command.

In the nonvolatile memory page and buffer compare, the command includes an identification of the buffer with which data from the memory page is to be compared, and the result of the compare operation, which is a compare flag, is output. A page 204 of data is transferred from the flash array 202 to the utility memory 210 through the gate 206 in preferably 128 bit segments. If the first buffer is identified, the page is read from the utility memory 210 in eight bit segments over an eight bit data path established by read/write multiplexer 212, read multiplexer 216, and sense amplifier 220 to the data cell 221. In addition, a page is read from the SRAM buffer 223 in eight bit segments over an eight bit data path established by multiplexer 222, sense amplifier 225, and multiplexer 224 into the data cell 221. Next, the two pages are compared in the data cell 221, and the resulting eight compare bits are shifted from the data cell 221 as SDOUT into a flag register (illustratively a register in the memory control circuit and registers block 160 shown in FIG. 1). If the second buffer is identified, the page is read from the utility memory 210 in eight bit segments over an eight bit data path established by read/write multiplexer 212, read multiplexer 216, and sense amplifier 230 to the data cell 231. In addition, a page is read from the SRAM buffer 233 in eight bit segments over an eight bit data path established by multiplexer 232, sense amplifier 235, and multiplexer 234 into the data cell 231. Next, the two pages are compared in the data cell 231, and resulting eight compare bits are shifted from the data cell 221 as SDOUT into a flag register.

In the buffer write operation, the command includes an identification of the SRAM buffer to which data is to be written, and the data remains in the identified buffer after the operation is completed. If the first buffer is identified, serial input data is received by the data cell 221 over a one bit path established by the input multiplexer 242. The data is then transferred to the appropriate position in the page over an eight bit data path from the data cell 221 to the SRAM buffer 223 through the multiplexer 222. If the second buffer is identified, serial input data is received by the data cell 231 over a one bit path established by the input multiplexer 242. The data is then transferred to the appropriate position in the page over an eight bit data path from the data cell 231 to the SRAM buffer 233 through the multiplexer 232. The entire page of data stored in an SRAM buffer may be overwritten in this manner, or selected one or more bytes may be overwritten.

Data may be written to the utility memory 210 without affecting the contents of the SRAM buffers, so that the utility memory 210 may be uses as an independent buffer or as a register. In the particular embodiment of FIG. 4, such data should not be used to program the transistor 326 without first being inverted. Serial input data is received by one of the data cells, for example the data cell 221, over a one bit path established by the input multiplexer 242. The data is then transferred to the utility memory 210 in an appropriate position in the page over an eight bit data path from the data cell 221 to the utility memory 210 through the write multiplexer 218 and read/write multiplexer 212. Alternatively, serial input data may be received by the data cell 231 over a one bit path established by the input multiplexer 242. The data is then transferred to the utility memory 210 in an appropriate position in the page over an eight bit data path from the data cell 231 to the utility memory 210 through the write multiplexer 218 and read/write multiplexer 212.

In the nonvolatile memory page program from buffer with erase operation, the command includes an identification of the buffer from which data is to be written to the nonvolatile memory array, and the data remains in the identified buffer after the operation is completed. First, the addressed page is erased. Then, if the first buffer is identified, a page is transferred from the SRAM buffer 223 to the utility memory 210 in eight bit segments over an eight bit data path established by multiplexer 222, sense amplifier 225, multiplexer 224, data cell 221, write multiplexer 218, and read/write multiplexer 212. Once the page transfer to the utility memory 210 is complete, program verify of the flash array 202 proceeds and the SRAM buffer 223 is accessible independently of the program-verify operation if the transfer program verify technique is used. Otherwise, the SRAM buffer 223 is accessible for external commands after the program-verify operation is complete, but without the need to restore the SRAM buffer 223 by reading the data from the flash array 202. If the second buffer is identified, a page is transferred from the SRAM buffer 233 to the utility memory 210 in eight bit segments over an eight bit data path established by multiplexer 232, sense amplifier 235, multiplexer 234, data cell 231, write multiplexer 218, and read/write multiplexer 212. Once the page transfer to the utility memory 210 is complete, program-verify of the flash array 202 proceeds. The SRAM buffer 233 is accessible in the manner described above for the SRAM buffer 223.

The nonvolatile memory page program from buffer without erase operation is identical to the nonvolatile memory page program from buffer with erase operation, except that the page is not automatically erased prior to programming.

In the nonvolatile memory page program through buffer, the command includes an identification of the buffer through which data is to be written to the nonvolatile memory array, and the data remains in the identified buffer after the operation is completed. First, the addressed page is erased if the first buffer is identified, serial input data is received by the data cell 221 over a one bit path established by the input multiplexer 242. The data is then transferred to the appropriate position in the page over an eight bit data path from the data cell 221 to the SRAM buffer 223 through the multiplexer 222. The data also is transferred to the appropriate position in the page over an eight bit data path from the data cell 221 to the utility memory 210 through the write multiplexer 218, and read/write multiplexer 212. Once the page transfer to the utility memory 210 is complete, program-verify of the flash array 202 proceeds and the SRAM buffer 223 is accessible depending on the type of program-verify used, as described above. If the second buffer is identified, serial input data is received by the data cell 231 over a one bit path established by the input multiplexer 242. The data is then transferred to the appropriate position in the page over an eight bit data path from the data cell 231 to the SRAM buffer 233 through the multiplexer 232. The data also is transferred to the appropriate position in the page over an eight bit data path from the data cell 231 to the utility memory 210 through the write multiplexer 218, and read/write multiplexer 212. Once the page transfer to the utility memory 210 is complete, program-verify of the flash array 202 proceeds and the SRAM buffer 233 is accessible depending on the type of program-verify used, as described above.

It will be appreciated that the functionality of the nonvolatile memory page program through buffer command is achievable by combining the buffer write command with the nonvolatile memory page program from buffer command.

In the nonvolatile memory page program without buffer operation, the contents of the SRAM buffers is unaffected by programming of the nonvolatile memory. First, the addressed page is erased. Serial input data is received by one of the data cells, for example the data cell 221, over a one bit path established by the input multiplexer 242. The data is then transferred to the utility memory 210 in an appropriate position in the page over an eight bit data path from the data cell 221 to the utility memory 210 through the write multiplexer 218 and read/write multiplexer 212. Once the page transfer to the utility memory 210 is complete, program-verify of the flash array 202 proceeds. Alternatively, serial input data may be received by the data cell 231 over a one bit path established by the input multiplexer 242. The data is then transferred to the utility memory 210 in an appropriate position in the page over an eight bit data path from the data cell 231 to the utility memory 210 through the write multiplexer 218 and read/write multiplexer 212. Once the page transfer to the utility memory 210 is complete, program verify of the flash array 202 proceeds. Both of the SRAM buffers 223 and 233 are immediately accessible independently of the program verify operation, after the program data has been written to the utility memory 210.

More complex operations such as read-modify-write are also supported. Many such operations are merely combinations of simpler operations. For instance, a read-modify-write operation may be formed by combining a nonvolatile memory page to buffer transfer, a buffer write in which one byte, several bytes, or all of the bytes in the page are overwritten, and a nonvolatile memory page program from buffer with erase. The read-modify-write operation may be implemented in a single specific command, or with the separate commands for the nonvolatile memory page to buffer transfer, the buffer write, and the nonvolatile memory page program from buffer with erase.

Although the memory embodiment of FIG. 3 uses a single utility memory 210 for both of the SRAM buffers 223 and 233, generally speaking, more than one utility memory may be used if desired. For example, in one arrangement a utility memory may be used with each volatile buffer memory so that successive pages of program data written to the buffer memories may be immediately transferred from the buffer memories to the respective utility memories thereof, thereby immediately freeing up each of the buffer memories. In another example, two or more utility memories are arranged in a pipeline, so that data in the buffer memories may be immediately transferred to the pipeline, thereby immediately freeing up each of the buffer memories.

The description of the invention and its applications as set forth herein is illustrative and is not intended to limit the scope of the invention. Variations and modifications of the embodiments disclosed herein are possible, and practical alternatives to and equivalents of the various elements of the embodiments are known to those of ordinary skill in the art. For example, a variety of alternative voltage levels and biasing schemes, including negative substrate bias, may be used for all of the various circuits described herein. For example, the input/output line may be implemented as one combined line or as separate input and output lines. Moreover, although the input/output is shown as serial, it may also be a parallel input/output transferring two or more bits at a time. These and other variations and modifications of the embodiments disclosed herein may be made without departing from the scope and spirit of the invention.

What is claimed is:

1. An integrated circuit memory comprising:
   a nonvolatile memory array programmable in a page mode;
   a first memory connected to the memory array, the first memory being volatile memory and of a size sufficient to hold a page of data, and having a program latch capability, a sense amplifier capability, and a verify read capability;
   a second memory coupled to the first memory, the second memory being volatile memory and of a size sufficient to hold a page of data, and having a buffer capability; and
   an input/output circuit coupled to the second memory to provide access to the second memory externally of the integrated circuit memory.

2. The integrated circuit memory of claim 1 further comprising:
   a third memory coupled to the first memory, the third memory being volatile memory and of a size sufficient to hold a page of data, and having a buffer capability;
   wherein the input/output circuit is further coupled to the third memory to provide access to the third memory externally of the integrated circuit memory.

3. The integrated circuit memory of claim 2, wherein:
   the nonvolatile memory array is a flash memory array comprising a plurality of single transistor floating gate memory cells programmed and erased using Fowler-Nordheim tunneling;
   the first memory comprises a page of cross-coupled inverter memory elements;
   the second memory comprises a page of SRAM elements; and
   the third memory comprises a page of SRAM elements.

4. The integrated circuit memory of claim 1 further comprising a program-verify detector coupled to the first memory.

5. The integrated circuit memory of claim 1 further comprising a program-verify detector coupled to the first memory and to the second memory.

6. The integrated circuit memory of claim 1 further comprising a comparator coupled to the first memory and to the second memory.

7. The integrated circuit memory of claim 2 further comprising:
   a first program-verify detector coupled to the first memory;
   a first comparator coupled to the first memory and to the second memory;
   a second program-verify detector coupled to the first memory; and
   a second comparator coupled to the first memory and to the third memory.

8. The integrated circuit memory of claim 2 further comprising:
   a first program-verify detector coupled to the first memory and to the second memory;
   a first comparator coupled to the first memory and to the second memory;
   a second program-verify detector coupled to the first memory and to the third memory; and
   a second comparator coupled to the first memory and to the third memory.

9. The integrated circuit memory of claim 2 wherein the input/output circuit is further coupled to the first memory to provide access to the first memory externally of the integrated circuit memory and independently of the second and third memories.

10. The integrated circuit memory of claim 9 wherein the external access to the first memory is read access.

11. The integrated circuit memory of claim 9 wherein the external access to the first memory is write access.

12. The integrated circuit memory of claim 9 wherein the external access to the first memory is read and write access.

13. The integrated circuit memory of claim 12 wherein:

the first memory further has a register capability; and the external access to the first memory is read and write access for utilizing the register capability of the first memory.

14. An integrated circuit memory comprising:

a nonvolatile flash memory array comprising a plurality of single transistor floating gate memory cells, the memory array being programmable in a page mode;

a gate circuit for providing a page of simultaneous connections to the flash memory array during flash memory array program operations and a plurality of successive simultaneous fractional page connections during flash memory array read operations;

a volatile utility memory of a size for holding a page of data, the utility memory being connected to the memory array by the gate circuit;

a plurality of volatile SRAM buffers, each being of a size for holding a page of data;

an input/output circuit;

a plurality of data cells having respective first byte inputs and first byte outputs respectively coupled to the SRAM buffers, each of the data cells further comprising:

a second byte input coupled to the utility memory;

a second byte output coupled to the utility memory;

a shift register having a bit serial input coupled to the input/output circuit, a bit serial output coupled to the input/output circuit, a byte input, and a byte output;

a comparator coupled to the first and second byte inputs and having a byte output for providing comparison bits, the byte input of the shift register being coupled to the byte output of the comparator; and a program verifier coupled to the second byte input and having a byte output for providing program verify bits; and a zero detector having an input coupled to the byte output of the program verifier and having a flag output coupled to the input/output circuit.

15. A method of writing a page of write data to an integrated circuit nonvolatile memory comprising:

writing the write data to a page of buffer memory;

writing the write data from the buffer memory to a page of utility memory without disturbing the write data in the buffer memory, the utility memory having a latch capability and a verify read capability;

programming the write data from the utility memory into a page of a nonvolatile memory array utilizing the latch capability of the utility memory;

reading the page of the nonvolatile memory array utilizing the verify read capability of the utility memory to provide verify data in the utility memory;

programming the verify data from the utility memory into the page of the nonvolatile memory array utilizing the latch capability of the utility memory when the verify data in the utility memory indicates that programming is incomplete;

re-reading the page of the nonvolatile memory array utilizing the verify read capability of the utility memory to refresh the verify data in the utility memory in response to the verify data programming step; and ceasing programming of the nonvolatile memory when the verify data in the utility memory indicates that programming is complete.

16. The method of claim 15 further comprising:

detecting the absence of a predetermined set of bits in the utility memory to determine that the verify data in the utility memory indicates incomplete programming; and detecting the presence of a predetermined set of bits in the utility memory to determine that the verify data in the utility memory indicates complete programming.

17. The method of claim 16 wherein the predetermined set of bits is a page of zeros.

18. The method of claim 15 wherein the utility memory further has a sense amplifier capability, further comprising reading the page of the nonvolatile memory array, after the ceasing programming step, utilizing the sense amplifier capability of the utility memory to provide read data in the utility memory.

19. The method of claim 18 further comprising writing the read data from the utility memory to the buffer memory.

20. The method of claim 15 further comprising writing new data to the page of the buffer memory after the step of writing the write data from the buffer memory to the page of utility memory, and during the step of programming the verify data from the utility memory into the page of the nonvolatile memory array.

21. A method of writing a page of write data to an integrated circuit nonvolatile memory comprising:

writing the write data to a page of buffer memory;

writing the write data from the buffer memory to a page of utility memory without disturbing the write data in the buffer memory, the utility memory having a latch capability and a verify read capability;

programming the write data from the utility memory into a page of a nonvolatile memory array utilizing the latch capability of the utility memory;

reading the page of the nonvolatile memory array utilizing the verify read capability of the utility memory to provide verify data in the utility memory;

programming the verify data from the utility memory into the page of the nonvolatile memory array utilizing the latch capability of the utility memory when the verify data in the utility memory and the write data in the buffer memory indicate that programming is incomplete;

re-reading the page of the nonvolatile memory array utilizing the verify read capability of the utility memory to refresh the verify data in the utility memory in response to the verify data programming step; and ceasing programming of the nonvolatile memory when the verify data in the utility memory and the write data in the buffer memory indicates that programming is complete.

22. The method of claim 21 wherein the utility memory further has a sense amplifier capability, further comprising reading the page of the nonvolatile memory array, after the ceasing programming step, utilizing the sense amplifier capability of the utility memory to provide read data in the utility memory.

23. The method of claim 21 further comprising writing new data to the page of the buffer memory after the ceasing programming step.

* * * * *